United States Patent
Kim et al.

(10) Patent No.: US 8,969,895 B2
(45) Date of Patent: Mar. 3, 2015

(54) SEMICONDUCTOR LIGHT EMITTING DEVICE AND MANUFACTURING METHOD THEREOF

(75) Inventors: Jae Yoon Kim, Gyunggi-do (KR); Jin Bock Lee, Gyunggi-do (KR); Seok Min Hwang, Busan (KR); Su Yeol Lee, Gyunggi-do (KR)

(73) Assignee: Samsung Electronics Co., Ltd., Seoul (KR)

( * ) Notice: Subject to any disclaimer, the term of this patent is extended or adjusted under 35 U.S.C. 154(b) by 0 days.

(21) Appl. No.: 13/225,979

(22) Filed: Sep. 6, 2011

(65) Prior Publication Data
US 2012/0098009 A1  Apr. 26, 2012

(30) Foreign Application Priority Data
Oct. 25, 2010 (KR) .................. 10-2010-0104215

(51) Int. Cl.
*H01L 33/00* (2010.01)
*H01L 33/40* (2010.01)
*H01L 33/38* (2010.01)
*H01L 33/42* (2010.01)
*H01L 33/32* (2010.01)

(52) U.S. Cl.
CPC .............. *H01L 33/405* (2013.01); *H01L 33/38* (2013.01); *H01L 33/42* (2013.01); *H01L 33/32* (2013.01); *H01L 2933/0016* (2013.01)
USPC .............. 257/98; 257/E33.064; 257/E33.074; 438/29

(58) Field of Classification Search
CPC .............................. H01L 33/42; H01L 33/60
USPC ............... 257/98, E33.064, E33.074; 438/29
See application file for complete search history.

(56) References Cited

U.S. PATENT DOCUMENTS

| | | | | |
|---|---|---|---|---|
| 6,614,056 | B1 * | 9/2003 | Tarsa et al. | 257/91 |
| 7,982,236 | B2 * | 7/2011 | Sano et al. | 257/99 |
| 2007/0145380 | A1 | 6/2007 | Shum et al. | |
| 2008/0142824 | A1 * | 6/2008 | Chen et al. | 257/98 |
| 2008/0185606 | A1 * | 8/2008 | Sano et al. | 257/98 |

(Continued)

FOREIGN PATENT DOCUMENTS

| | | |
|---|---|---|
| CN | 1433578 A | 7/2003 |
| JP | 08-250769 A | 9/1996 |

(Continued)

OTHER PUBLICATIONS

Chinese Office Action, w/ English translation thereof, issued in Chinese Patent Application No. CN 201110301262.8 dated Dec. 18, 2013.

*Primary Examiner* — Caleb Henry
(74) *Attorney, Agent, or Firm* — McDermott Will & Emery LLP

(57) ABSTRACT

A semiconductor light emitting device includes: a light emission structure in which a first conductive semiconductor layer, an active layer and a second conductive semiconductor layer are sequentially stacked; a first electrode formed on the first conductive semiconductor layer; an insulating layer formed on the second conductive semiconductor layer and made of a transparent material; a reflection unit formed on the insulating layer and reflecting light emitted from the active layer; a second electrode formed on the reflection unit; and a transparent electrode formed on the second conductive semiconductor layer, the transparent electrode being in contact with the insulating layer and the second electrode.

15 Claims, 6 Drawing Sheets

(56) References Cited

U.S. PATENT DOCUMENTS

| | | | |
|---|---|---|---|
| 2009/0261373 A1* | 10/2009 | Shum et al. | 257/98 |
| 2010/0090237 A1* | 4/2010 | Jeong | 257/98 |
| 2011/0233596 A1* | 9/2011 | Sano et al. | 257/98 |
| 2011/0244611 A1* | 10/2011 | Kim | 438/29 |
| 2011/0260184 A1* | 10/2011 | Furuyama | 257/98 |
| 2011/0284908 A1* | 11/2011 | Muramoto et al. | 257/98 |

FOREIGN PATENT DOCUMENTS

| | | | | |
|---|---|---|---|---|
| JP | 2003224297 A * | 8/2003 | | H01L 33/00 |
| JP | 2004-140416 | 5/2004 | | |
| JP | 2008-300719 | 12/2008 | | |

* cited by examiner

SEMICONDUCTOR LIGHT EMITTING DEVICE AND MANUFACTURING METHOD THEREOF

CROSS-REFERENCE TO RELATED APPLICATIONS

This application claims the priority of Korean Patent Application No. 10-2010-0104215 filed on Oct. 25, 2010, in the Korean Intellectual Property Office, the disclosure of which is incorporated herein by reference.

BACKGROUND OF THE INVENTION

1. Field of the Invention

The present invention relates to a semiconductor light emitting device and, more particularly, to a semiconductor light emitting device including an insulating layer and a reflection part disposed on a light emission structure to thus have excellent light extraction efficiency, and a method for manufacturing the same.

2. Description of the Related Art

A light emitting diode, a type of semiconductor light emitting device, is a semiconductor device capable of generating light of various colors according to the electron and hole recombination in p and n type semiconductor junction parts when current is applied thereto. Compared with a light emitting device based on a filament, the semiconductor light emitting device has various advantages such as a long life span, low power consumption, excellent initial driving characteristics, high vibration resistance, and the like, so demand for the semiconductor light emitting device continues to grow. In particular, recently, a group III-nitride semiconductor capable of emitting light of a short-wavelength blue light has come to prominence.

In the semiconductor light emitting device, power is applied to an n type semiconductor layer and a p type semiconductor layer to cause electrons and holes to be combined in the junction area thereof to emit light. Thus, in order to apply power to the n type and p type semiconductor layers, n type and p type electrodes are formed on the n type and p type semiconductor layers. However, such metal n type and p type electrodes absorb light, rather than emitting light to the outside, thereby degrading the light extraction efficiency of the light emitting device. In particular, this problem becomes severe when the contact surface of the electrodes and the semiconductor layers are extended to improve current spreading characteristics. Thus, a method allowing for the designing of a semiconductor light emitting device having both excellent current spreading characteristics and excellent light extraction efficiency is required.

SUMMARY OF THE INVENTION

An aspect of the present invention provides a semiconductor light emitting device having a structure in which a reflection unit and an insulating layer are formed at a lower side of metal electrodes, to thus improve the current spreading characteristics and light extraction efficiency thereof.

According to an aspect of the present invention, there is provided a semiconductor light emitting device including: a light emission structure in which a first conductive semiconductor layer, an active layer and a second conductive semiconductor layer are sequentially stacked; a first electrode formed on the first conductive semiconductor layer; an insulating layer formed on the second conductive semiconductor layer and made of a transparent material; a reflection unit formed on the insulating layer and reflecting light emitted from the active layer; a second electrode formed on the reflection unit; and a transparent electrode formed on the second conductive semiconductor layer, the transparent electrode being in contact with the insulating layer and the second electrode.

The reflection unit may be formed in an area formed by removing a portion of the transparent electrode.

The second electrode may have a larger area than that of the reflection unit in order to cover the reflection unit.

The insulating layer may have the area larger than that of the second electrode.

The active layer may be formed on a portion of one surface of the first conductive semiconductor layer, and the first electrode may be formed on an area, excluding the area in which the active layer is formed, of the one surface of the first conductive semiconductor layer.

The first electrode may include a first main electrode and a first branch electrode extending from the first main electrode, and the second electrode may include a second main electrode and a second branch electrode extending from the second main electrode.

The width of the insulating layer may be 2 to 6 times that of the second branch electrode (namely, a ratio of 2:1 to 6:1 exists therebetween).

The first and second electrodes may be made of at least one of chromium (Cr) and gold (Au).

The reflection unit may be made of at least one of aluminum (Al) and silver (Ag).

The transparent electrode layer may include at least one layer made of an oxide selected from the group consisting of indium tin oxide (ITO), indium oxide (IO), tin-based oxide ($SnO_2$), zinc oxide (ZnO), and indium zinc oxide (IZO).

In this case, the thickness of the insulating layer may range from 1000 Å to 10000 Å.

According to an aspect of the present invention, there is also provided a method for manufacturing a semiconductor light emitting device, including: sequentially stacking a first conductive semiconductor layer, an active layer, and a second conductive semiconductor layer on a substrate; selectively removing portions of the second conductive semiconductor layer, the active layer, and the first conductive semiconductor layer; forming a first electrode in the area formed by the removal of a portion of the first conductive semiconductor layer; forming an insulating layer on a portion of the second conductive semiconductor layer; forming a transparent electrode on the second conductive semiconductor layer and the insulating layer; removing a portion of the transparent electrode formed on the insulating layer to expose a portion of the insulating layer; forming a reflection unit in the area in which the insulating layer is exposed; and forming a second electrode on the transparent electrode and the reflection unit.

In the selectively removing the portions of the second conductive semiconductor layer, the active layer, the first conductive semiconductor layer, the portions of the second conductive semiconductor layer, the active layer, and the first conductive semiconductor layer may be mesa-etched to expose the portion of the first conductive semiconductor layer.

In order to remove a portion of the transparent electrode formed on the insulating layer, a portion of the transparent electrode may be etched using a mask.

In the forming of the reflection unit in the area in which the insulating layer is exposed, the reflection unit may be formed by using the mask.

The second electrode may have a larger area than that of the reflection unit to cover the reflection unit.

The insulating layer may have a larger area than that of the second electrode.

BRIEF DESCRIPTION OF THE DRAWINGS

The above and other aspects, features and other advantages of the present invention will be more clearly understood from the following detailed description taken in conjunction with the accompanying drawings, in which:

FIG. 2 is a plan view of the semiconductor light emitting device of FIG. 1 viewed from an upper side of a second electrode, wherein FIG. 1 is a schematic cross-sectional view taken along the plane A-A' shown in FIG. 2;

DETAILED DESCRIPTION OF THE PREFERRED EMBODIMENT

Figure 1:
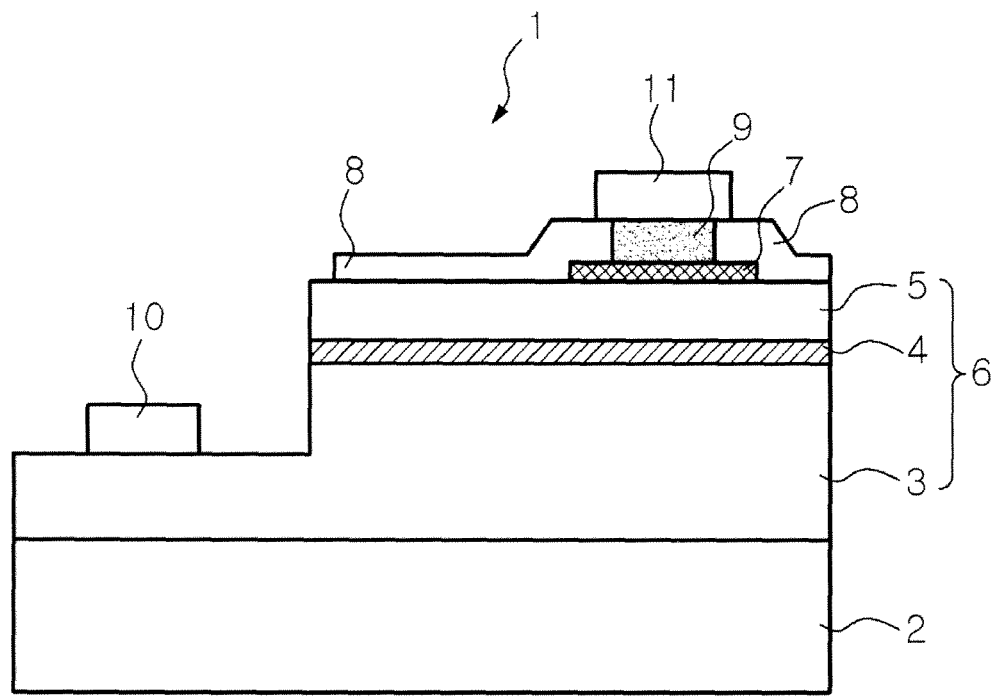
FIG. 1 is a schematic cross-sectional view of a semiconductor light emitting device according to an exemplary embodiment of the present invention.

Exemplary embodiments of the present invention will now be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

FIG. 1 is a schematic sectional view of a semiconductor light emitting device according to an exemplary embodiment of the present invention.

With reference to FIG. 1, a semiconductor light emitting device 1 includes a substrate 2, a light emission structure 6, an insulating layer 7, a reflection unit 9, a transparent electrode 8, a first electrode 10, and a second electrode 11. The substrate 2 is a growth substrate provided to allow a nitride semiconductor layer to grow thereon, and an insulation substrate such as a sapphire substrate may be used as the substrate 2. In addition, a conductive substrate, a metal substrate such as SiC, Si, GaN, AlN, or a plated layer, may also be used therefor.

A light emission structure 6 in which a first conductive semiconductor layer 3, an active layer 4, and a second conductive semiconductor layer 5 are sequentially stacked is provided on the substrate 2.

The first conductive semiconductor layer 3 and the second conductive semiconductor layer 5 may be configured as a $In_xAl_yGa_{1-x-y}N$ ($0 \leq x$, $0 \leq y$, $x+y \leq 1$) semiconductor single layer or multiple layers. As the first conductive semiconductor layer 3 and the second conductive semiconductor layer 5, an n type or p type semiconductor layer is formed by the doping with a dopant. N type dopants may include group VI elements or group IV elements such as Si, Ge, Sn, S, 0, Ti, Zr, etc., and p type dopants may include Be, Zn, Mn, Cr, Mg, Ca, etc.

The active layer 4 may be configured to include semiconductor multiple layers, group III nitride-based layers including a different composition of a multi-quantum well structure. The active layer 4 emits energy, which is generated as holes and electrons injected from the first conductive semiconductor layer 3 into the second conductive semiconductor layer 5, respective n type or p type semiconductor layers, as light. The active layer 4 is formed on at least a portion of the upper surface of the first conductive semiconductor layer 3.

The insulating layer 7 is formed on at least a portion of the upper surface of the second conductive semiconductor layer 5. The insulating layer 7 serves to prevent current, which is injected from the second electrode 11, from being concentrated in a transparent electrode area immediately under the second electrode 11. Namely, the presence of the insulating layer 7 prevents the current, which is injected from the second electrode 11, from being introduced into the second conductive layer immediately under the insulating layer 7, and distributes the current to the entire region of the transparent electrode, so that the current can be evenly distributed to the active layer 4. In order to minimize the absorption of light emitted from the active layer 4 into the insulating layer 7, preferably, the insulating layer 7 is made of a transparent material.

The transparent electrode 8 is formed on the insulating layer 7. The transparent electrode 8 serves as a passage for delivering the current injected from the second electrode 11. The transparent electrode 8 is made of a transparent material to allow light emitted from the active layer 4 to be transmitted therethrough. The transparent electrode 8 may be made of a material selected from the group consisting of indium tin oxide (ITO), indium oxide (IO), tin-based oxide ($SnO_2$), zinc oxide (ZnO), and indium zinc oxide (IZO).

The reflection unit 9 is formed on the insulating layer 7. The reflection unit 9 may be formed at a portion, on the insulating layer 7, formed by removing the transparent electrode 8 from the insulating layer 7. The reflection unit 9 can reflect light generated from the active layer 4 to reduce light absorption by the second electrode 11 and improve luminous efficiency. The reflection unit 9 may be made of any one of Al and Ag.

In order to form the first electrode 10, a portion of the light emission structure 6 including the first conductive semiconductor layer 3, the active layer 4, and the second conductive semiconductor layer 5 may be selectively removed, and then, the first electrode 10 may be formed in an area of the light emission structure 6, excluding the area in which the active layer 4 of the first conductive semiconductor layer 3 is formed.

The second electrode 11 is formed on the reflection unit 9. In the present exemplary embodiment, the second electrode 11 is provided to cover an upper portion of the area in which the reflection unit 9 and the transparent electrode 8 are formed, and in this case, the second electrode 11 is formed to cover a larger area than that of the area of the reflection unit 9.

The first and second electrodes 10 and 11 may be made of at least any one of chromium (Cr) and gold (Au).

Figure 2:
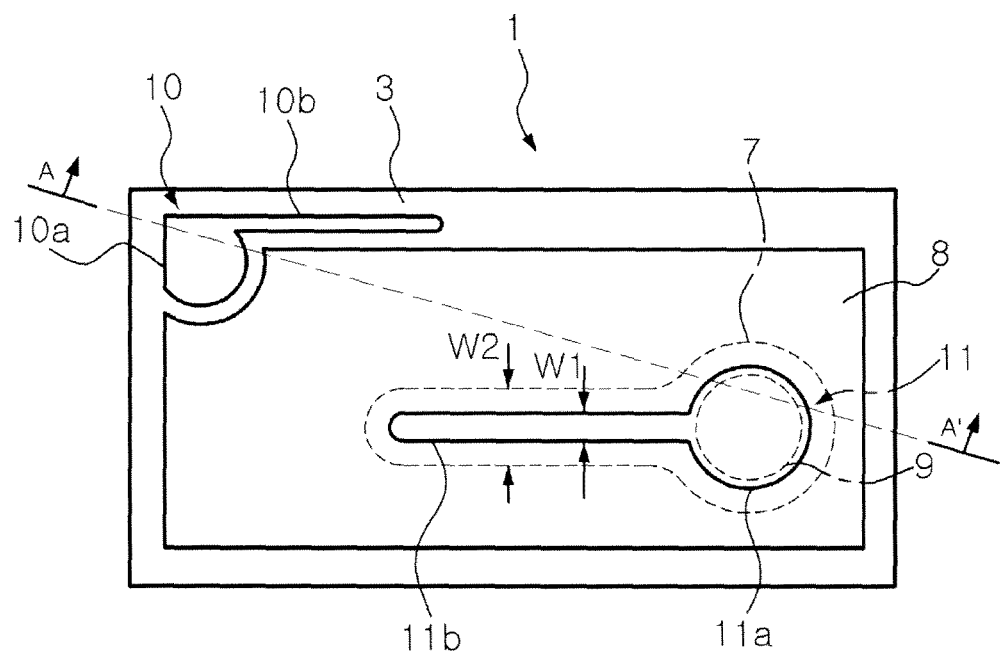

FIG. 2 is a plan view of the semiconductor light emitting device of FIG. 1 viewed from an upper side of the second electrode 11. wherein FIG. 1 is a schematic cross-sectional view taken along the plane A-A' shown in FIG. 2. With reference to FIG. 1, the first electrode 10 may include a first main electrode 10a and a first branch electrode 10b formed to extend from the first main electrode 10a along the surface of the first conductive semiconductor layer 3. The second electrode 11 may include a second main electrode 11a and a second branch electrode 11b formed to extend from the second main electrode 11a along the surface of the transparent electrode 8.

In detail, the first main electrode 10a is formed to be adjacent to one corner of the upper surface of the first conductive semiconductor layer 3. The first branch electrode 10b extends from the first main electrode 10a toward another corner along one side of the upper surface of the first conductive semiconductor layer 3.

The second main electrode 11a is formed to be adjacent to a corner diagonally opposed to the one corner of the first conductive semiconductor layer 3 on the transparent electrode 8. The second branch electrode 11b is formed along the other side opposed to the one side where the first main electrode 10a is formed.

Meanwhile, preferably, the area of the insulating layer 7 is greater than that of the second electrode 11, and the area of the second electrode 11 is greater than that of the reflection unit 9, in consideration of current spreading and light extraction efficiency. Details will be described with reference to a Table shown below and FIGS. 3a to 3g.

Preferably, the first branch electrode 10b and the second branch electrode 11b may be spaced apart by a certain distance, and current spreading and distribution uniformity can be promoted between the first and second electrodes 10 and 11. Meanwhile, the reflection unit 9 according to the present exemplary embodiment may be formed only at an area corresponding to the second main electrode 11a of the second electrode 11. Also, in the present exemplary embodiment, the first and second electrodes 10 and 11 are provided as a pair and are disposed to be spaced apart, but the present invention is not particularly limited thereto and any structure advantageous for current spreading, such as a structure in which the second electrode 11 is disposed to be horizontally symmetrical overall based on the first electrode 10, or the like, may be applicable.

In order to evenly spread current, the relationship between the width W1 of the second branch electrode and the width W2 of the insulating layer 7 is significant. The width W1 of the second branch electrode is approximately 5 μm Emission power by light extracted from the active layer 4 according to the width W2 of the insulating layer 7 as measured is shown in the Table below.

TABLE

| W2 | VF [V] | Po [mW] | Rate |
|---|---|---|---|
| 14 μm | 3.18 | 30.50 | 1.021 |
| 24 μm | 3.19 | 30.57 | 1.024 |
| 34 μm | 3.19 | 30.54 | 1.022 |
| 44 μm | 3.20 | 30.49 | 1.021 |
| Reference (5 μm) | 3.18 | 29.87 | 1 |

In the above Table, VF is a voltage difference [V] between the first and second electrodes, and Po is emission power by light extracted from the active layer.

When emission power obtained when the width W1 of the second branch electrode is 5 μm is used as a reference value, the size of emission power when the width W2 of the insulating layer is 24 μm, the size of emission power is improved by approximately 2.4% compared with the reference value. In order to effectively extract light from the active layer, the width W2 of the insulating layer is preferably 2 to 6 times that of the width W1 of the second branch electrode (namely, a ratio of 2:1 to 6:1 may preferably exist therebetween).

Here, the advantage obtained in the case in which the second electrode 11 includes the area in which the reflection unit 9 is formed, and covers the upper portion of the reflection unit 9 such that an area larger than the upper portion is covered will now be described.

Figure 3A:
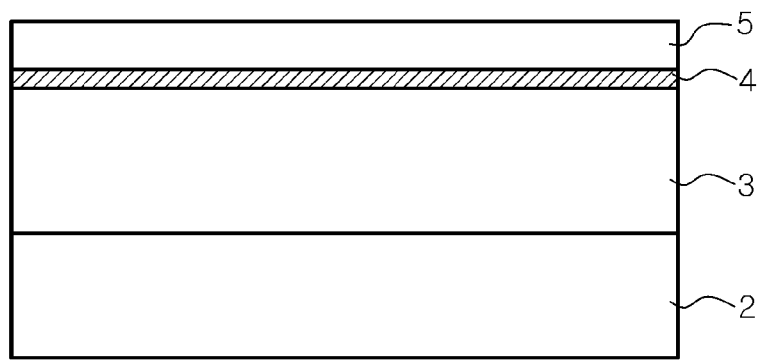
FIGS. 3a to 3g are cross-sectional views showing a sequential process of manufacturing the semiconductor light emitting device according to an exemplary embodiment of the present invention.

FIGS. 3a to 3g are cross-sectional views showing a sequential process of manufacturing the semiconductor light emitting device according to an exemplary embodiment of the present invention. Specifically, FIGS. 3a to 3g are sectional views showing sequential processes of forming the reflection unit and the second electrode of the semiconductor light emitting device of FIG. 1. Here, in order to help understand the present invention, only the vertical section of the position corresponding to the second main electrode 11a of the semiconductor light emitting device 1 is shown. With reference to FIG. 3a, the first conductive semiconductor layer 3, the active layer 4, and the second conductive semiconductor layer 5 may be sequentially stacked on the substrate 2. The first and second conductive semiconductor layers 3 and 5, each formed as a group III nitride-based semiconductor single crystal, and the active layer 4 may be grown by using MOCVD (Metal Organic Chemical Vapor Deposition), MBE (Molecular Beam Epitaxy), HVPE (Hydride Vapor Phase Epitaxy), or formed by sputtering, PLD (Pulsed Laser Deposition), or the like.

Figure 3B:
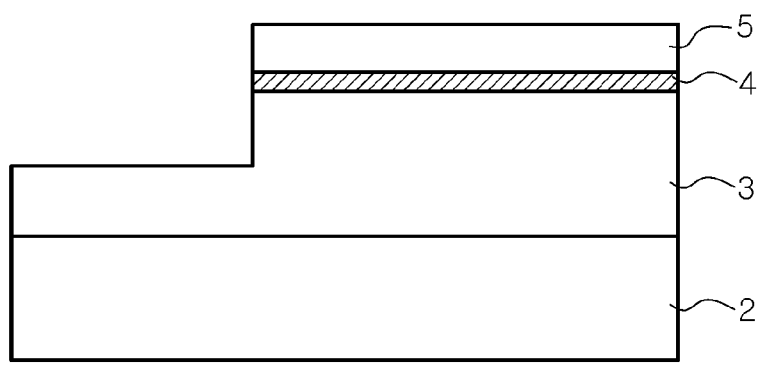

With reference to FIG. 3b, portions of the second conductive semiconductor layer 5, the active layer 4, and the first conductive semiconductor layer 3 may be selectively removed. For example, portions of the second conductive semiconductor layer 5, the active layer 4, and the first conductive semiconductor layer 3 may be mesa-etched to expose a portion of the first conductive semiconductor layer 3.

Figure 3C:
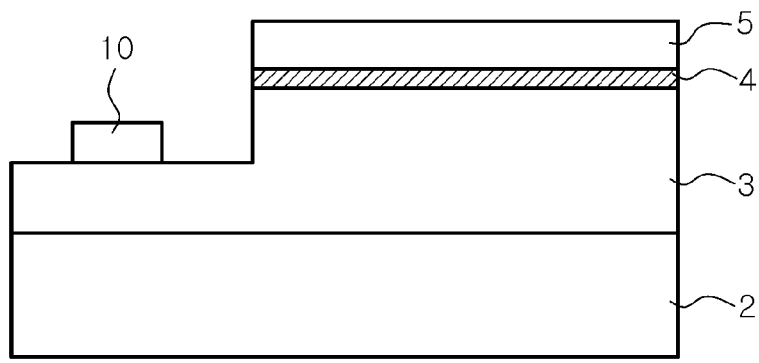
Figure 3D:
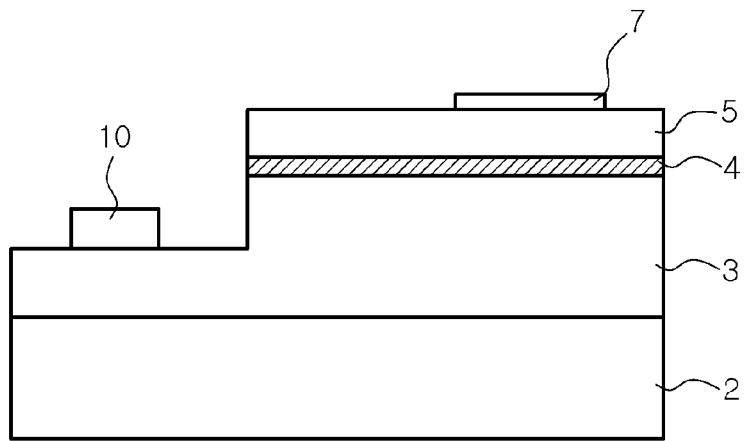
Figure 3E:
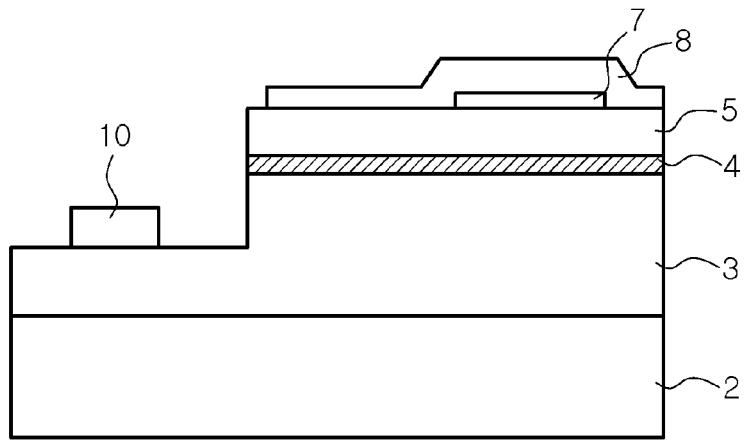

With reference to FIGS. 3c to 3e, the first electrode 10 is formed in an area formed by removing a portion of the first conductive semiconductor layer 3, the insulating layer 7 may be formed in an area of the second conductive semiconductor layer 5, and the transparent electrode 8 may be formed on the second conductive semiconductor layer 5 and the insulating layer 7.

Figure 3F:
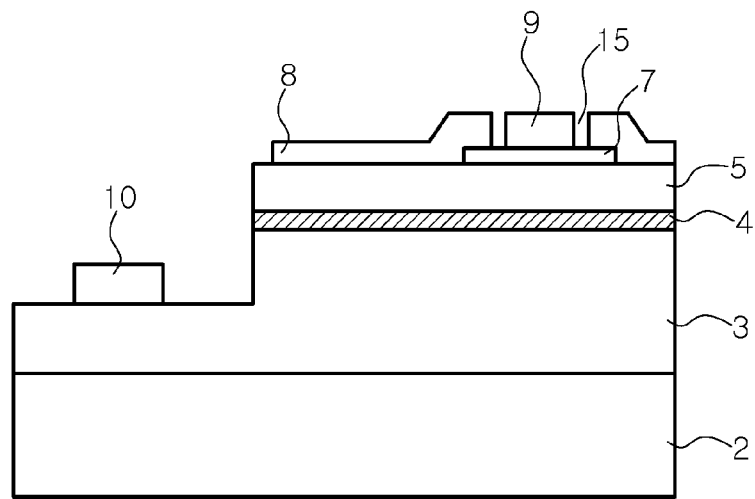
Figure 3G:
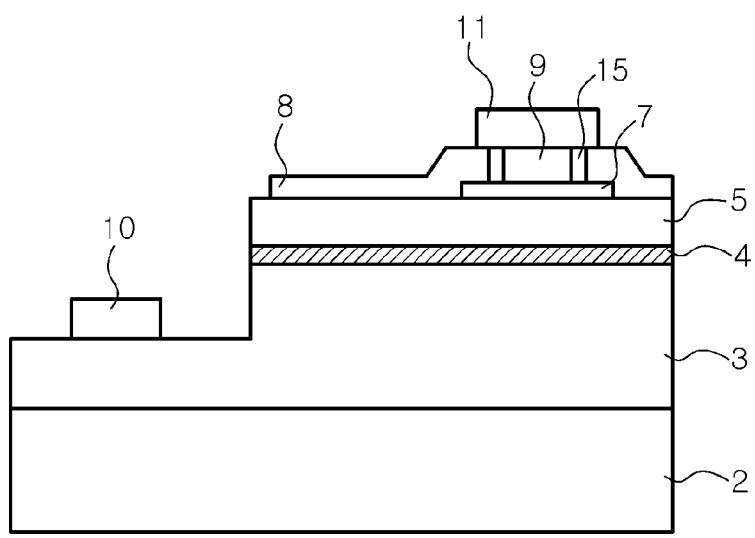

With reference to FIG. 3f, portions of the transparent electrode 8 on the insulating layer 7 may be removed. To this end, the portions of the transparent electrode 8 on the insulating layer 7 may be etched by using a mask (not shown). Preferably, the reflection unit 9 is formed by using the same mask (not shown) after the etching process. In this case. an unintended gap 15 is formed between the reflection unit 9 and the transparent electrode 8, electrically separating them. In this case, if the second electrode 11 is formed such that it has a smaller area than that of the reflection unit 9, namely, when the second electrode 11 is formed only on the reflection unit 9, the second electrode 11 and the transparent electrode 8 could not be electrically connected. Thus, as shown in FIG. 3g, the second electrode 11 is formed to cover up to a portion of the transparent electrode 8 including the area in which the transparent electrode 8 is formed. Accordingly, although a gap is formed between the reflection unit 9 and the transparent electrode 8, because the second electrode 11 and the transparent electrode 8 are directly in contact with each other, they can be electrically connected.

Figure 4:
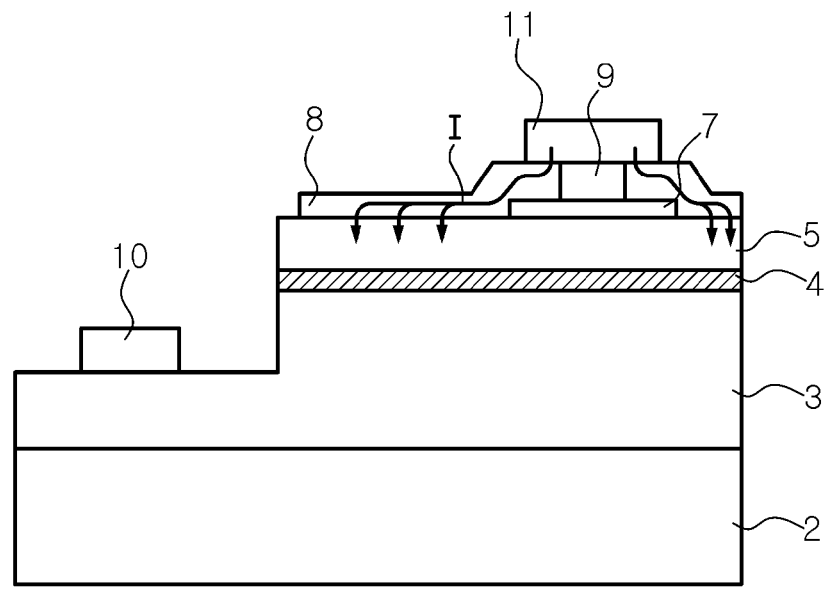
FIG. 4 is a schematic view showing current flowing from the second electrode into a light emission structure through a transparent electrode according to an exemplary embodiment of the present invention.

FIG. 4 is a schematic view showing current I flowing from the second electrode into a light emission structure through a transparent electrode according to an exemplary embodiment of the present invention. With reference to FIG. 4, the insulating layer 7 is provided under portions of the reflection unit 9 and the transparent electrode 8. Thus, current I, injected from the second electrode, can be prevented from being concentrated in the light emission structure 6 immediately under the second electrode 11. Accordingly, because the current I injected from the second electrode 11 is evenly distributed to the light emission structure 6 through the transparent electrode 8, the light extraction efficiency can be increased.

Figure 5:
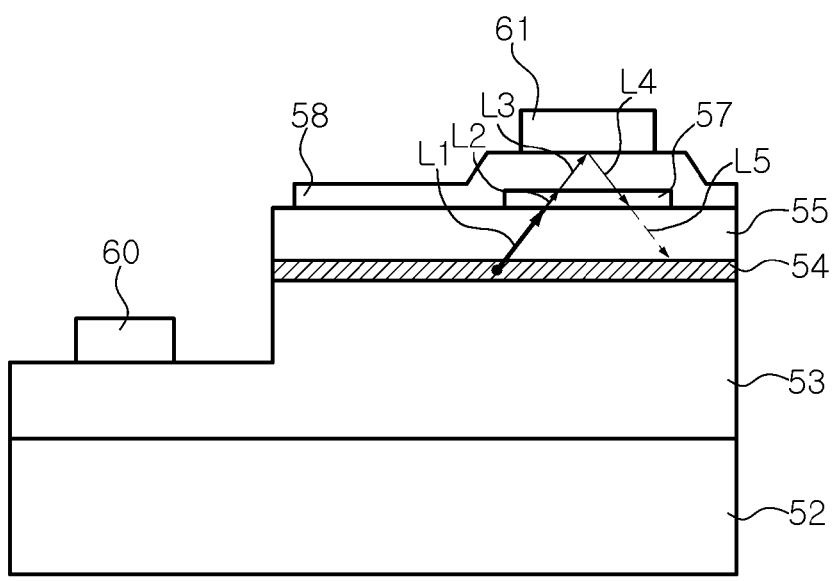
FIG. 5 is a schematic view showing a proceeding path of light generated from an active layer when a reflection unit is omitted in a semiconductor light emitting device according to an exemplary embodiment of the present invention.
Figure 6:
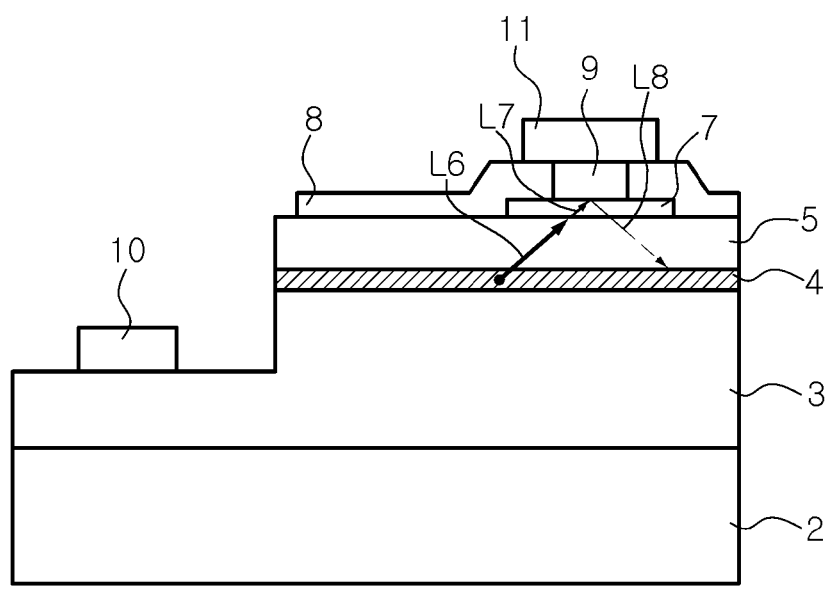
FIG. 6 is a schematic view showing a proceeding path of light generated from an active layer in a semiconductor light emitting device according to an exemplary embodiment of the present invention.

FIG. 5 is a schematic view showing a proceeding path of light generated from an active layer when a reflection unit is omitted in a semiconductor light emitting device according to an exemplary embodiment of the present invention. FIG. 6 is a schematic view showing a proceeding path of light generated from an active layer in a semiconductor light emitting device according to an exemplary embodiment of the present invention.

In detail, with reference to FIG. 5, the semiconductor light emitting device includes a substrate 52, a first conductive semiconductor layer 53, an active layer 54, a second conductive semiconductor layer 55, an insulating layer 57, a transparent electrode 58, a first electrode 60, and a second electrode 61. Light L1 generated from the active layer 54 of the semiconductor light emitting device spreads to the entire surface of the semiconductor light emitting device without a certain directionality, and in case of a general semiconductor light emitting device, because the active layer 54 is formed to be closer to the upper side, a relatively large amount of light is emitted to the upper side. However, the light emitted in the upward direction of the semiconductor light emitting device is primarily absorbed by the insulating layer 57 so as to be partially lost (L2), and then secondarily absorbed by the transparent electrode 58 so as to be partially lost (L3). Light (L3), portions of which have been lost, is tertiarily absorbed by the second electrode 61 so as to be lost. Light (L3), which has not been absorbed, reflected from the second electrode 61, is tertiarily absorbed by the transparent electrode 58 (L4). As a result, light (L5) remaining after the absorbing process is weaker than the first generated light (L1), so such loss of light causes a degradation of overall light extraction efficiency.

With reference to FIG. 6, the semiconductor light emitting device according to an exemplary embodiment of the present invention includes a substrate 2, a first conductive semiconductor layer 3, an active layer 4, a second conductive semiconductor layer 5, an insulating layer 7, a transparent electrode 8, a first electrode 10, a second electrode 11, and a reflection unit 9. The reflection unit 9 having a low light absorption rate is provided under the second electrode 11, so light (L6) generated from the active layer 4 is partially absorbed by the insulating layer 7 (L7) but the light is reflected with a smaller amount thereof being lost, compared with the device without the reflection unit 9. In this case, the reflected light (L8) may be discharged (or emitted) to outside through the side of the semiconductor light emitting device, or when a light-transmissive substrate 2 is formed, the light (L8) may be discharged through the substrate 2, or the light (L8) may be directly discharged from the interface, or may be extracted to outside through reflection or the like.

The reflectance (or a reflectivity) of light which is reflected by the reflection unit 9 after being generated from the active layer 4 is higher when the insulating layer 7 is provided below the reflection unit 9. To obtain a high reflectance, preferably, when the reflection unit 9 is made of aluminum (Al) and the insulating layer 4 is made of silicon dioxide (SiO2), the thickness of the insulating layer 7 may range from 1,000 Å to 10,000 Å, preferably, from 2,000 Å to 7,000 Å.

As set forth above, according to exemplary embodiments of the invention, in the semiconductor light emitting device, because the electrode includes the main electrode and the branch electrode, the current distribution characteristics can be improved. In addition, because the reflection unit is disposed on an area after removing a portion of the transparent electrode, light emitted from the active layer can be reflected, rather than being absorbed by the electrode, and externally discharged. Also, because current injected through the electrode is evenly distributed to the light emission structure, light extraction efficiency can be improved.

While the present invention has been shown and described in connection with the exemplary embodiments, it will be apparent to those skilled in the art that modifications and variations can be made without departing from the spirit and scope of the invention as defined by the appended claims.

What is claimed is:

1. A semiconductor light emitting device, comprising:
   a light emission structure in which a first conductive semiconductor layer, an active layer, and a second conductive semiconductor layer are sequentially stacked;
   a first electrode disposed on the first conductive semiconductor layer;
   an insulating layer disposed on the second conductive semiconductor layer and made of a transparent material;
   a reflection unit disposed on the insulating layer and reflecting light emitted from the active layer;
   a second electrode disposed on the reflection unit; and
   a transparent electrode disposed on the second conductive semiconductor layer, the transparent electrode being in direct contact with the insulating layer and the second electrode and surrounding side surfaces of the reflection unit,
   wherein the insulating layer is disposed on the second conductive semiconductor layer in an area aligned in the stacking direction of the light emission structure with both the second electrode and the reflection unit.

2. The device of claim 1, wherein the second electrode has a larger area than an area of the reflection unit in order to cover the reflection unit.

3. The device of claim 1, wherein the insulating layer has a larger area than an area of the second electrode and is disposed on the second conductive semiconductor layer throughout the area aligned in the stacking direction of the light emission structure with the second electrode.

4. The device of claim 1, wherein the active layer is disposed on a portion of one surface of the first conductive semiconductor layer, and the first electrode is disposed on an area, excluding the area in which the active layer is disposed, of the one surface of the first conductive semiconductor layer.

5. The device of claim 1, wherein the first electrode comprises a first main electrode and a first branch electrode extending from the first main electrode, and the second electrode comprises a second main electrode and a second branch electrode extending from the second main electrode.

6. The device of claim 5, wherein a width of the insulating layer is 2 to 6 times a width of the second branch electrode.

7. The device of claim 1, wherein the first and second electrodes include at least one of chromium (Cr) and gold (Au).

8. The device of claim 1, wherein the reflection unit includes at least one of aluminum (Al) and silver (Ag).

9. The device of claim 1, wherein the transparent electrode comprises at least one layer including an oxide selected from the group consisting of indium tin oxide (ITO), indium oxide (IO), tin-based oxide ($SnO_2$), zinc oxide (ZnO), and indium zinc oxide (IZO).

10. The device of claim 1, wherein the thickness of the insulating layer ranges from 1,000Å to 10,000Å.

11. A lighting device comprising the semiconductor light emitting device of claim 1.

12. The device of claim 1, wherein the insulating layer is disposed on the second conductive semiconductor layer between portions of the transparent electrode and the second conductive semiconductor layer.

13. The device of claim 1, wherein the insulating layer is disposed between the second conductive semiconductor layer and the reflection unit such that the reflection unit does not directly contact the second conductive semiconductor layer.

14. The device of claim 1, wherein the reflection unit is disposed on the insulating layer such that the reflection unit does not extend beyond an outer perimeter of the insulating layer.

15. The device of claim 1, wherein the second electrode is in direct contact with the reflection unit and the transparent electrode.

* * * * *